United States Patent
Yoon et al.

(10) Patent No.: US 10,983,646 B2
(45) Date of Patent: Apr. 20, 2021

(54) PRESSURE DETECTABLE TOUCH INPUT DEVICE INCLUDING DISPLAY MODULE

(71) Applicant: HiDeep Inc., Seongnam-si (KR)

(72) Inventors: Sang Sic Yoon, Seongnam-si (KR); Se Yeob Kim, Seongnam-si (KR); Yun Joung Kim, Seongnam-si (KR); Bon Kee Kim, Seongnam-si (KR)

(73) Assignee: HiDeep Inc., Seongnam-si (KR)

( * ) Notice: Subject to any disclaimer, the term of this patent is extended or adjusted under 35 U.S.C. 154(b) by 124 days.

(21) Appl. No.: 15/567,581

(22) PCT Filed: May 26, 2016

(86) PCT No.: PCT/KR2016/005562
§ 371 (c)(1),
(2) Date: Oct. 18, 2017

(87) PCT Pub. No.: WO2016/204423
PCT Pub. Date: Dec. 22, 2016

(65) Prior Publication Data
US 2018/0150153 A1    May 31, 2018

(30) Foreign Application Priority Data
Jun. 17, 2015  (KR) .................. 10-2015-0085978

(51) Int. Cl.
*G06F 3/044* (2006.01)
*G06F 3/041* (2006.01)
*H01L 27/32* (2006.01)

(52) U.S. Cl.
CPC ............ *G06F 3/0446* (2019.05); *G06F 3/041* (2013.01); *H01L 27/32* (2013.01); *H01L 27/323* (2013.01); *G06F 2203/04112* (2013.01)

(58) Field of Classification Search
CPC ...... G06F 3/044; G06F 3/041; G06F 3/03412; H01L 27/32
See application file for complete search history.

(56) References Cited

U.S. PATENT DOCUMENTS 8,723,824 B2  5/2014 Myers et al.
8,976,141 B2  3/2015 Myers et al.
(Continued)

FOREIGN PATENT DOCUMENTS

JP   2015-049847 A   3/2015
JP   2015-069225 A   4/2015
(Continued)

OTHER PUBLICATIONS

Office Action for Japanese Patent Application No. JP 2017-551163, dated Jul. 17, 2018, 6 Pages.
(Continued)

*Primary Examiner* — Benyam Ketema
(74) *Attorney, Agent, or Firm* — Fenwick & West LLP (57) ABSTRACT

A touch input device which includes a display module and is capable of detecting a pressure may be provided. The touch input device includes: a display module including a flat portion and at least one curved portion which extends from the flat portion and is curved with a predetermined curvature; and a pressure detection module which is formed under the display module and detects a touch pressure applied to a surface of the display module. The pressure detection module detects the touch pressure on the basis of a capacitance change amount according to a distance change between a reference potential layer and the pressure detection module. As a result, the touch input device including various types and forms of the display modules is capable of efficiently detecting the touch position and touch pressure.

11 Claims, 8 Drawing Sheets

(56) References Cited

U.S. PATENT DOCUMENTS

| | | | |
|---|---|---|---|
| 9,298,220 | B2 | 3/2016 | Choi et al. |
| 9,304,538 | B2 | 4/2016 | Aaltonen et al. |
| 9,342,105 | B2 | 5/2016 | Choi et al. |
| 9,910,521 | B2* | 3/2018 | Ahn ................ G06F 3/0488 |
| 9,946,390 | B2* | 4/2018 | Lee ................ G06F 1/1613 |
| 9,990,125 | B2* | 6/2018 | Jung ................ G06F 3/04883 |
| 2006/0197750 | A1* | 9/2006 | Kerr ................ G06F 1/1626 345/173 |
| 2006/0197753 | A1* | 9/2006 | Hotelling ............ G06F 3/0416 345/173 |
| 2006/0238517 | A1* | 10/2006 | King ................ G06F 3/03547 345/173 |
| 2010/0085692 | A1* | 4/2010 | Kim ................ G06F 1/1656 361/679.01 |
| 2010/0127992 | A1* | 5/2010 | Schmid ................ G06F 3/045 345/173 |
| 2013/0018489 | A1 | 1/2013 | Grunthaner et al. |
| 2013/0076649 | A1 | 3/2013 | Myers et al. |
| 2013/0234734 | A1 | 9/2013 | Lida et al. |
| 2013/0249860 | A1 | 9/2013 | Seo et al. |
| 2014/0168090 | A1 | 6/2014 | Aaltonen et al. |
| 2014/0240289 | A1 | 8/2014 | Myers et al. |
| 2014/0267128 | A1 | 9/2014 | Bulea et al. |
| 2015/0130767 | A1 | 5/2015 | Myers et al. |
| 2015/0185911 | A1* | 7/2015 | Kim ................ G06F 3/044 349/12 |
| 2015/0227227 | A1 | 8/2015 | Myers et al. |
| 2015/0241926 | A1* | 8/2015 | Park ................ G06F 3/04883 345/173 |
| 2015/0249729 | A1* | 9/2015 | Kim ................ G09G 3/2092 455/566 |
| 2015/0324056 | A1* | 11/2015 | Sato ................ G06F 1/169 345/174 |
| 2015/0331451 | A1* | 11/2015 | Shin ................ H04M 1/0277 345/173 |
| 2016/0011691 | A1 | 1/2016 | Shinkai et al. |
| 2016/0066440 | A1 | 3/2016 | Choi et al. |
| 2016/0125225 | A1 | 5/2016 | Ebihara et al. |
| 2016/0147375 | A1* | 5/2016 | Bok ................ G06F 3/0416 345/175 |
| 2016/0183364 | A1* | 6/2016 | Choi ................ G09G 5/00 361/679.01 |
| 2016/0187994 | A1* | 6/2016 | La ................ G06F 1/1677 345/619 |
| 2016/0295176 | A1* | 10/2016 | Jeong ................ H04N 9/30 |
| 2016/0364057 | A1* | 12/2016 | Chi ................ G06F 3/0414 |
| 2017/0277359 | A1* | 9/2017 | Lee ................ G06F 1/1626 |
| 2018/0190916 | A1* | 7/2018 | Kim ................ G06F 1/1637 |
| 2019/0273217 | A1* | 9/2019 | Lee ................ H01L 51/0097 |
| 2019/0346957 | A1* | 11/2019 | Hong ................ G06F 3/041 |

FOREIGN PATENT DOCUMENTS

| | | |
|---|---|---|
| JP | 2015-109252 A | 6/2015 |
| KR | 10-2011-0134068 A | 12/2011 |
| KR | 10-2013-0107640 A | 2/2013 |
| KR | 10-2014-0014755 A | 2/2014 |
| KR | 10-2014-0023428 A | 2/2014 |
| KR | 10-2014-0066253 A | 5/2014 |
| KR | 10-1516766 B1 | 5/2015 |
| WO | WO 2014/141584 A1 | 9/2014 |
| WO | WO 2014/207989 A1 | 12/2014 |
| WO | WO 2015/060279 A1 | 3/2017 |

OTHER PUBLICATIONS

European Patent Office, Extended European Search Report and Opinion, EP Patent Application No. 16811836.2, dated Dec. 3, 2018, 14 pages.

Halleck, T. "Samsung will Release Galaxy S6 with Two Curved Edges, a Glass Back and Non-Removable Battery, Reports say," Ibtimes.com, eight pages.

Orf, D., "Samsung Galaxy S6 Edge: A Quirk that doesn't really Work," Gizmodo, Jan. 4, 2015, four pages.

Savov, V., "Living Life on the S6 Edge," The Verge, Mar. 31, 2015, six pages.

PCT International Search Report, PCT/KR2016/005562, dated Sep. 23, 2016, 5 Pages.

Intellectual Property India, Examination Report, in Patent Application No. 201747038820, dated Jul. 15, 2020, five pages.

* cited by examiner

PRESSURE DETECTABLE TOUCH INPUT DEVICE INCLUDING DISPLAY MODULE

TECHNICAL FIELD

The present disclosure relates to a touch input device which includes a display module and is capable of detecting a pressure and more particularly to a touch input device which includes various types of display modules and is capable of detecting a pressure.

BACKGROUND ART

Various kinds of input devices are being used to operate a computing system. For example, the input device includes a button, key, joystick and touch screen. Since the touch screen is easy and simple to operate, the touch screen is increasingly being used in operation of the computing system.

The touch screen may constitute a touch surface of a touch input device including a touch sensor panel which may be a transparent panel including a touch-sensitive surface. The touch sensor panel is attached to the front side of a display screen, and then the touch-sensitive surface may cover the visible side of the display screen. The touch screen allows a user to operate the computing system by simply touching the touch screen by a finger, etc. Generally, the computing system recognizes the touch and the touch position on the touch screen and analyzes the touch, and thus, performs the operations accordingly.

Meanwhile, various types and shapes of display modules may be used in the touch screen. Therefore, the touch input device capable of efficiently detecting the touch position and touch pressure is increasingly required as the touch input device including the various types and shapes of display panels.

DISCLOSURE

Technical Problem

The present invention is designed to meet the above requirement. The object of the present invention is to provide a touch input device which includes various types and shapes of display modules and is capable of efficiently detecting the touch position and touch pressure.

Technical Solution

One embodiment is a touch input device capable of detecting a pressure. The touch input device includes: a display module including a flat portion and at least one curved portion which extends from the flat portion and is curved with a predetermined curvature; and a pressure detection module which is formed under the display module and detects a touch pressure applied to a surface of the display module. The pressure detection module detects the touch pressure on the basis of a capacitance change amount according to a distance change between a reference potential layer and the pressure detection module.

The pressure detection module may be located under at least one of the flat portion and the curved portion of the display module.

The pressure detection module may include an electrode for detecting the pressure and may detect the touch pressure on the basis of a capacitance change amount according to a distance change between the electrode and the reference potential layer by the touch.

The display module may include an OLED panel.

The reference potential layer may be formed of a substrate made of a flexible material.

The curved portion may extend from at least one of both sides of the flat portion.

Another embodiment is a touch input device including: a display module having a shape curved with a predetermined curvature; and a pressure detection module which is formed under the display module and detects a touch pressure applied to a surface of the display module. The pressure detection module detects the touch pressure on the basis of a capacitance change amount according to a distance change between a reference potential layer and the pressure detection module.

The pressure detection module may include an electrode for detecting the pressure and may detect the touch pressure on the basis of a capacitance change amount according to a distance change between the electrode and the reference potential layer by the touch.

The display module may include an OLED panel.

Further another embodiment is a touch input device capable of detecting a touch position and a touch pressure. A front side of the touch input device includes: a touch sensor panel which detects the touch position; and a display module which is provided under the touch sensor panel. A pressure detection module which detects the touch pressure on the basis of a capacitance change amount according to a distance change between a reference potential layer and the pressure detection module is provided in at least one of right, left, up and down sides and back side.

The pressure detection module may be located under a side cover provided on the side of the touch input device.

The pressure detection module may be located under a side display module provided on the side of the touch input device.

The touch input device may further include a side touch sensor panel which is provided on the side display module and detects the touch position on the side.

Yet another embodiment is a touch input device which is capable of detecting a touch position and a touch pressure and has a front side thereof divided into a display area and a non-display area. The display area includes: a touch sensor panel which detects the touch position; and a display module which is provided under the touch sensor panel. The non-display area includes at least one pressure detection module which detects the touch pressure on the basis of a capacitance change amount according to a distance change between a reference potential layer and the pressure detection module.

The at least one pressure detection module may be covered by a cover layer made of a flexible material.

Advantageous Effects

The touch input device according to the above configuration of the embodiment of the present invention is capable of efficiently detecting the touch position and touch pressure regardless of the type or form of the display module.

Also, since the pressure detection module is able to take the place of a conventional mechanical button, it is possible to ensure a much simpler design of a non-button touch input device as well as to prevent mechanical defects, breakdown, etc., and to reduce the manufacturing process and cost.

MODE FOR INVENTION

Specific embodiments of the present invention will be described in detail with reference to the accompanying drawings. The specific embodiments shown in the accompanying drawings will be described in enough detail that those skilled in the art are able to embody the present invention. Other embodiments other than the specific embodiments are mutually different, but do not have to be mutually exclusive. Additionally, it should be understood that the following detailed description is not intended to be limited.

The detailed descriptions of the specific embodiments shown in the accompanying drawings are intended to be read in connection with the accompanying drawings, which are to be considered part of the entire written description. Any reference to direction or orientation is merely intended for convenience of description and is not intended in any way to limit the scope of the present invention.

Specifically, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation.

Terms such as "attached," "affixed," "connected," "coupled," "interconnected," and similar refer to a relationship wherein structures are attached, connected or fixed to one another either directly or indirectly through intervening structures, as well as both movable or rigid attachments or relationships, unless expressly described otherwise.

Hereafter, a touch input device according to an embodiment of the present invention will be described in detail with reference to the accompanying drawings.

The touch input device according to the embodiment of the present invention which includes a display module and is capable of detecting a pressure can be used not only in portable electronic products such as a smartphone, a smartwatch, a tablet PC, a laptop computer, personal digital assistants (PDA), an MP3 player, a camera, a camcorder, an electronic dictionary, etc., but also in home appliances such as a home PC, TV, DVD, a refrigerator, an air conditioner, a microwave oven, etc. Also, the touch input device according to the embodiment of the present invention which includes a display module and is capable of detecting a pressure can be used without limitation in all of the products that require a device for display and input, such as an industrial control device, a medical equipment, etc.

Figure 1:
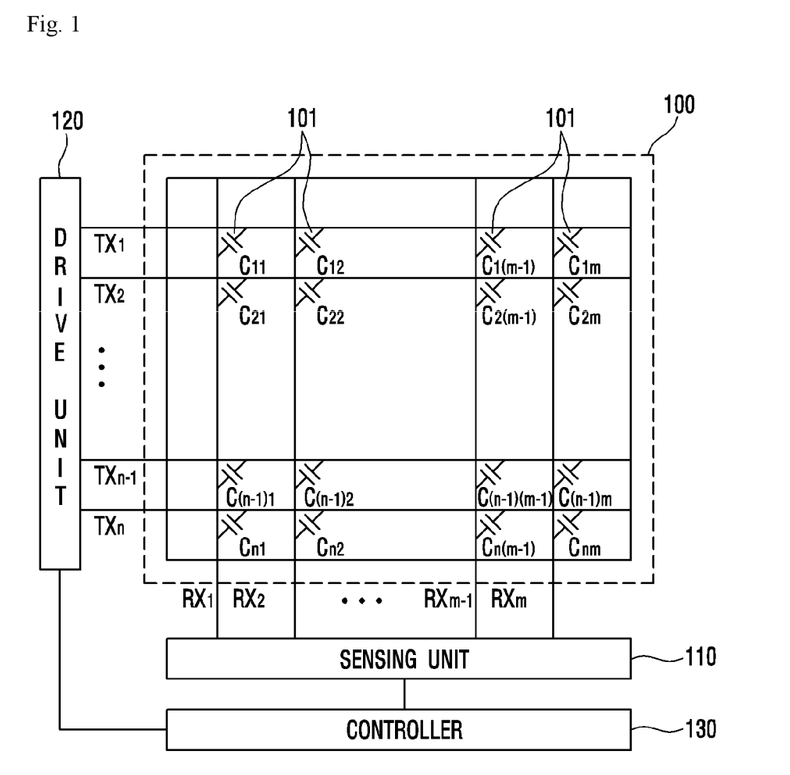
FIG. 1 is a view for describing a configuration and operation of a touch sensor panel that is one component of a touch input device according to an embodiment of the present invention.

FIG. 1 is a view for describing a configuration and operation of a capacitance type touch sensor panel 100 included in the touch input device according to the embodiment of the present invention. Referring to FIG. 1, the touch sensor panel 100 may include a plurality of drive electrodes TX1 to TXn and a plurality of receiving electrodes RX1 to RXm, and may include a drive unit 120 which applies a drive signal to the plurality of drive electrodes TX1 to TXn for the purpose of the operation of the touch sensor panel 100, and a sensing unit 110 which detects the touch and the touch position by receiving a sensing signal including information on the capacitance change amount changing according to the touch on the touch surface of the touch sensor panel 100.

As shown in FIG. 1, the touch sensor panel 100 may include the plurality of drive electrodes TX1 to TXn and the plurality of receiving electrodes RX1 to RXm. While FIG. 1 shows that the plurality of drive electrodes TX1 to TXn and the plurality of receiving electrodes RX1 to RXm of the touch sensor panel 100 form an orthogonal array, the present invention is not limited to this. The plurality of drive electrodes TX1 to TXn and the plurality of receiving electrodes RX1 to RXm has an array of arbitrary dimension, for example, a diagonal array, a concentric array, a 3-dimensional random array, etc., and an array obtained by the application of them. Here, "n" and "m" are positive integers and may be the same as each other or may have different values. The magnitude of the value may be changed depending on the embodiment.

As shown in FIG. 1, the plurality of drive electrodes TX1 to TXn and the plurality of receiving electrodes RX1 to RXm may be arranged to cross each other. The drive electrode TX may include the plurality of drive electrodes TX1 to TXn extending in a first axial direction. The receiving electrode RX may include the plurality of receiving electrodes RX1 to RXm extending in a second axial direction crossing the first axial direction.

In the touch sensor panel 100 according to the embodiment of the present invention, the plurality of drive electrodes TX1 to TXn and the plurality of receiving electrodes RX1 to RXm may be formed in the same layer. For example, the plurality of drive electrodes TX1 to TXn and the plurality of receiving electrodes RX1 to RXm may be formed on the same side of an insulation layer (not shown). Also, the plurality of drive electrodes TX1 to TXn and the plurality of receiving electrodes RX1 to RXm may be formed in different layers. For example, the plurality of drive electrodes TX1 to TXn and the plurality of receiving electrodes RX1 to RXm may be formed on both sides of one insulation layer (not shown) respectively, or the plurality of drive electrodes TX1 to TXn may be formed on a side of a first insulation layer (not shown) and the plurality of receiving electrodes RX1 to RXm may be formed on a side of a second insulation layer (not shown) different from the first insulation layer.

The plurality of drive electrodes TX1 to TXn and the plurality of receiving electrodes RX1 to RXm may be made of a transparent conductive material (for example, indium tin oxide (ITO) or antimony tin oxide (ATO) which is made of tin oxide (SnO2), and indium oxide (In2O3), etc.), or the like. However, this is only an example. The drive electrode TX and the receiving electrode RX may be also made of another transparent conductive material or an opaque conductive material. For instance, the drive electrode TX and the receiving electrode RX may include at least any one of silver ink, copper, nano silver, and carbon nanotube (CNT). Also, the drive electrode TX and the receiving electrode RX may be made of metal mesh.

The drive unit 120 according to the embodiment of the present invention may apply a drive signal to the drive electrodes TX1 to TXn. In the embodiment of the present invention, one drive signal may be sequentially applied at a time to the first drive electrode TX1 to the n-th drive electrode TXn. The drive signal may be applied again repeatedly. This is only an example. The drive signal may be applied to the plurality of drive electrodes at the same time in accordance with the embodiment.

Through the receiving electrodes RX1 to RXm, the sensing unit 110 receives the sensing signal including information on a capacitance (Cm) 101 generated between the receiving electrodes RX1 to RXm and the drive electrodes TX1 to TXn to which the drive signal has been applied, thereby detecting whether or not the touch has occurred and the touch position. For example, the sensing signal may be a signal coupled by the capacitance (Cm) 101 generated between the receiving electrode RX and the drive electrode TX to which the drive signal has been applied. As such, the process of sensing the drive signal applied from the first drive electrode TX1 to the n-th drive electrode TXn through the receiving electrodes RX1 to RXm can be referred to as a process of scanning the touch sensor panel 100.

As such, the process of sensing the drive signal applied from the first drive electrode TX1 to the n-th drive electrode TXn through the receiving electrodes RX1 to RXm can be referred to as a process of scanning the touch sensor panel 100.

For example, the sensing unit 110 may include a receiver (not shown) which is connected to each of the receiving electrodes RX1 to RXm through a switch. The switch becomes the on-state in a time interval during which the signal of the corresponding receiving electrode RX is sensed, thereby allowing the receiver to sense the sensing signal from the receiving electrode RX. The receiver may include an amplifier (not shown) and a feedback capacitor coupled between the negative (−) input terminal of the amplifier and the output terminal of the amplifier, i.e., coupled to a feedback path. Here, the positive (+) input terminal of the amplifier may be connected to the ground. Also, the receiver may further include a reset switch which is connected in parallel with the feedback capacitor. The reset switch may reset the conversion from current to voltage that is performed by the receiver. The negative input terminal of the amplifier is connected to the corresponding receiving electrode RX and receives and integrates a current signal including information on the capacitance (CM) 101, and then converts the integrated current signal into voltage. The sensing unit 110 may further include an analog to digital converter (ADC) (not shown) which converts the integrated data by the receiver into digital data. Later, the digital data may be input to a processor (not shown) and processed to obtain information on the touch on the touch sensor panel 100. The sensing unit 110 may include the ADC and processor as well as the receiver.

A controller 130 may perform a function of controlling the operations of the drive unit 120 and the sensing unit 110. For example, the controller 130 generates and transmits a drive control signal to the drive unit 120, so that the drive signal can be applied to a predetermined drive electrode TX1 at a predetermined time. Also, the controller 130 generates and transmits the drive control signal to the sensing unit 110, so that the sensing unit 110 may receive the sensing signal from the predetermined receiving electrode RX at a predetermined time and perform a predetermined function.

In FIG. 1, the drive unit 120 and the sensing unit 110 may constitute a touch detection device (not shown) capable of detecting whether or not the touch has occurred on the touch sensor panel 100 and the touch position. The touch detection device may further include the controller 130. The touch detection device may be integrated and implemented on a touch sensing integrated circuit (IC) in a touch input device 1000 including the touch sensor panel 100. The drive electrode TX and the receiving electrode RX included in the touch sensor panel 100 may be connected to the drive unit 120 and the sensing unit 110 included in the touch sensing IC 150 through, for example, a conductive trace and/or a conductive pattern printed on a circuit board, or the like. The touch sensing IC 150 may be placed on a circuit board on which the conductive pattern has been printed, for example, a first printed circuit board (hereafter, referred to as a first PCB). According to the embodiment, the touch sensing IC (not shown) may be mounted on a main board for operation of the touch input device 1000.

As described above, a capacitance (C) with a predetermined value is generated at each crossing of the drive electrode TX and the receiving electrode RX. When an object such as finger approaches close to the touch sensor panel 100, the value of the capacitance may be changed. In FIG. 1, the capacitance may represent a mutual capacitance (Cm). The sensing unit 110 senses such electrical characteristics, thereby being able to sense whether the touch has occurred on the touch sensor panel 100 or not and the touch position. For example, the sensing unit 110 is able to sense whether the touch has occurred on the surface of the touch sensor panel 100 comprised of a two-dimensional plane consisting of a first axis and a second axis and/or the touch position.

More specifically, when the touch occurs on the touch sensor panel 100, the drive electrode TX to which the drive signal has been applied is detected, so that the position of the second axial direction of the touch can be detected. Likewise, when the touch occurs on the touch sensor panel 100, a capacitance change is detected from the reception signal received through the receiving electrode RX, so that the position of the first axial direction of the touch can be detected.

The mutual capacitance type touch sensor panel as the touch sensor panel 100 has been described in detail in the foregoing. However, in the touch input device 1000 according to the embodiment of the present invention, the touch sensor panel 100 for detecting whether or not the touch has occurred and the touch position may be implemented by using not only the above-described method but also any touch sensing method like a self-capacitance type method, a surface capacitance type method, a projected capacitance type method, a resistance film method, a surface acoustic wave (SAW) method, an infrared method, an optical imaging method, a dispersive signal technology, and an acoustic pulse recognition method, etc.

In the touch input device 1000 to which a pressure detection module according to the embodiment can be applied, the touch sensor panel 100 for detecting the touch position may be positioned outside or inside a display module 200.

A display panel included in the display module 200 of the touch input device 1000 to which the pressure detection module according to the embodiment can be applied may be a display panel included in an organic light emitting diode (OLED), etc.

However, the display module 200 of the touch input device 1000 according to the embodiment of the present invention is not limited to this and may be another type of module capable of displaying, such as a liquid crystal display (LCD), a plasma display panel (PDP), etc.

Accordingly, a user may perform the input operation by touching the touch surface while visually identifying an image displayed on the display panel. Here, the display module 200 may include a control circuit which receives an input from an application processor (AP) or a central processing unit (CPU) on a main board for the operation of the touch input device 1000 and displays the contents that the user wants on the display panel. The control circuit may be mounted on a second printed circuit board (not shown). Here, the control circuit for the operation of the display panel may include a display panel control IC, a graphic controller IC, and a circuit required to operate other display panels.

Following the above description related to the operation of the touch sensor panel 100 sensing the touch position, the method and principle of sensing the touch pressure will be described with reference to FIGS. 2 and 3a to 3d.

Figure 2:
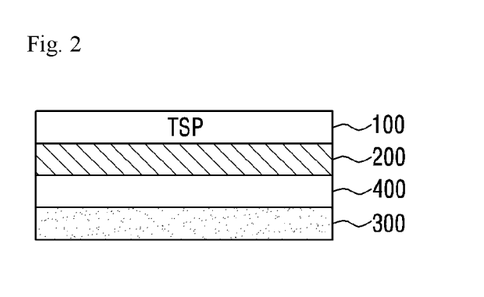
FIG. 2 is a view showing a configuration of the touch input device according to the embodiment of the present invention.

FIG. 2 is a view showing a configuration of the touch input device 1000 according to the embodiment of the present invention. FIGS. 3a to 3d are views which show the method of sensing the touch pressure and various embodiments of a pressure detection module 400 for the same.

As shown in FIG. 2, the touch input device 1000 according to the embodiment of the present invention includes the touch sensor panel 100, the display module 200, the pressure detection module 400, and a substrate 300. Here, the substrate 300 may be a reference potential layer. The reference potential layer of the touch input device 1000 according to another embodiment of the present invention may be arranged differently from FIG. 2. That is, the reference potential layer may be placed on the pressure detection module 400 or may be placed within the display module 200. Alternatively, one or more reference potential layers may be provided. Here, in correspondence to the stack structure of the touch input device 1000, the pressure detection module 400 may be disposed differently. This will be described in detail together with the description of the embodiments of FIGS. 3a to 3d.

Figure 3A:
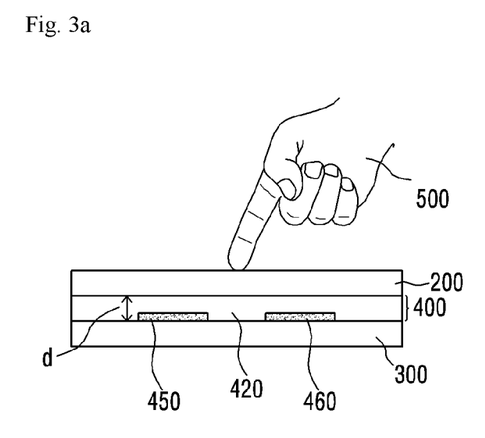
FIGS. 3a to 3d are views which describe a method of sensing a touch pressure in the touch input device according to the embodiment of the present invention and show the configuration of a pressure detection module according to various embodiments.

As shown in FIG. 3a, a spacer layer 420 may be disposed between the display module 200 and the substrate 300. Pressure electrodes 450 and 460 disposed according to the embodiment shown in FIG. 3a may be disposed on the substrate 300 side between the display module 200 and the substrate 300.

The pressure electrode for detecting the pressure may include the first electrode 450 and the second electrode 460. Here, any one of the first electrode 450 and the second electrode 460 may be the drive electrode, and the other may be the receiving electrode. A drive signal is applied to the drive electrode, and a sensing signal may be obtained through the receiving electrode. When voltage is applied, the mutual capacitance may be generated between the first electrode 450 and the second electrode 460.

Figure 3B:
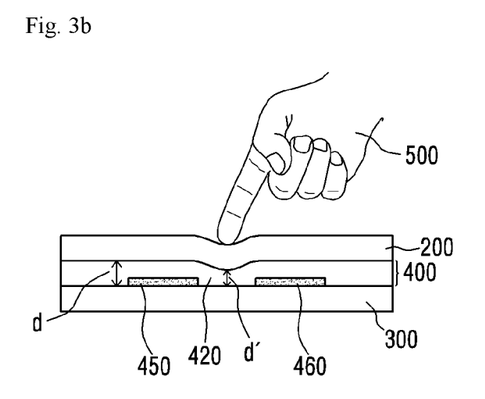

FIG. 3b is a cross sectional view when a pressure is applied to the touch input device 1000 shown in FIG. 3a. The bottom surface of the display module 200 may have a ground potential in order to shield the noise. When the pressure is applied to the surface of the touch sensor panel 100 by an object 500, the touch sensor panel 100 and the display module 200 may be bent. As a result, a distance "d" between a ground potential surface, i.e., the reference potential layer and the pressure electrode patterns 450 and 460 may be reduced to "d'". In this case, due to the reduction of the distance "d", a fringing capacitance is absorbed in the bottom surface of the display module 200, so that the mutual capacitance between the first electrode 450 and the second electrode 460 may be reduced. Therefore, the magnitude of the touch pressure can be calculated by obtaining the reduction amount of the mutual capacitance from the sensing signal obtained through the receiving electrode.

In the touch input device 1000 according to the embodiment of the present invention, when the touch pressure is applied to the display module 200, the touch position may be bent to show the largest deformation. When the display module 200 is bent according to the embodiment, a position showing the largest deformation may not match the touch position. However, the display module 200 is bent at least at the touch position. For example, when the touch position approaches close to the border, edge, etc., of the display module 200, the most bent position of the display module 200 may not match the touch position. However, the display module 200 may be shown to be bent at least at the touch position.

Figure 3C:
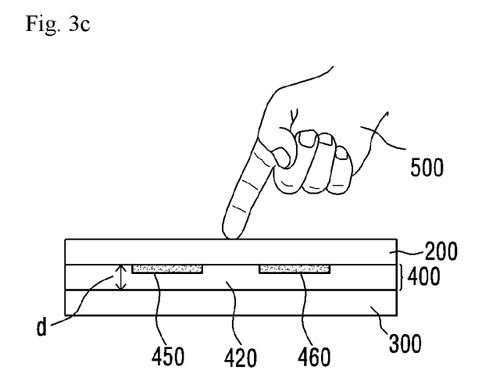

FIG. 3c shows the pressure electrode arrangement of the touch input device 1000 according to another embodiment of the present invention. In the electrode arrangement shown in FIG. 3c, the pressure electrodes 450 and 460 may be disposed on the display module 200 side between the display module 200 and the substrate 300.

The embodiment of FIGS. 3a and 3b shows that the pressure electrodes 450 and 460 are formed on the substrate 300. Also, it is possible to consider that the pressure electrodes 450 and 460 are formed on the bottom surface of the display module 200. Here, the substrate 300 as the reference potential layer may have a ground potential. Therefore, the distance "d" between the substrate 300 and the pressure electrodes 450 and 460 is reduced by touching the touch surface of the touch sensor panel 100. Consequently, this may cause the change of the mutual capacitance between the first electrode 450 and the second electrode 460.

Figure 3D:
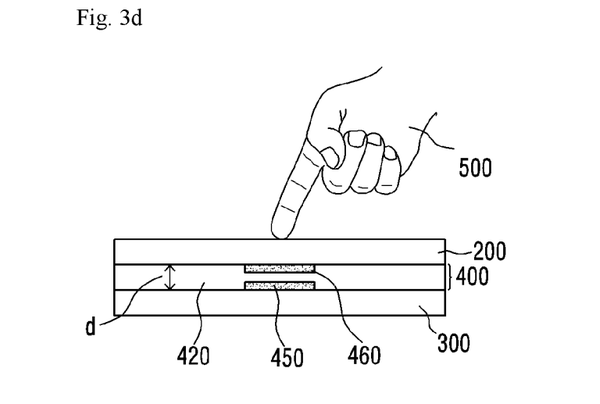

FIG. 3d shows the electrode arrangement of the touch input device 1000 according to further another embodiment of the present invention. In the embodiment of FIG. 3d, any one of the pressure electrodes 450 and 460 may be formed on the substrate 300 side, and the other may be formed on the bottom surface side of the display module 200. FIG. 3d shows that the first electrode 450 is formed on the substrate 300 side and the second electrode 460 is formed on the bottom surface side of the display module 200. Needless to say, the electrode arrangement can be also made in a manner to replace the positions of the first electrode 450 and the second electrode 460 with each other.

When the pressure is applied to the surface of the touch sensor panel 100 by the object 500, the touch sensor panel 100 and the display module 200 may be bent. Accordingly, the distance "d" between the first electrode 450 and the second electrode 460 may be reduced. In this case, due to the reduction of the distance "d", the mutual capacitance between the first electrode 450 and the second electrode 460 may be reduced. Therefore, the magnitude of the touch pressure can be calculated by obtaining the reduction amount of the mutual capacitance from the sensing signal obtained through the receiving electrode.

FIGS. 4a to 4f show a structural cross section of the pressure detection module 400 that is one component of the touch input device 1000 according to various embodiments.

Figure 4A:
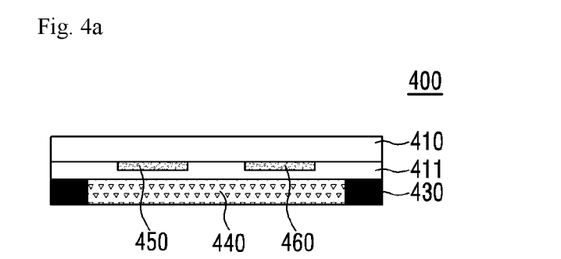
FIGS. 4a to 4f show a structural cross section of the pressure detection module that is one component of the touch input device according to various embodiments.

As shown in FIG. 4a, in the pressure detection module 400 according to the embodiment of the present invention, the pressure electrodes 450 and 460 are disposed between a first insulation layer 410 and a second insulation layer 411. For example, after the pressure electrodes 450 and 460 are formed on the first insulation layer 410, the pressure electrodes 450 and 460 may be covered with the second insulation layer 411. Here, the first insulation layer 410 and the second insulation layer 411 may be made of an insulating material such as polyimide. The first insulation layer 410 may be polyethylene terephthalate (PET), and the second insulation layer 411 may be a cover layer made of ink. The pressure electrodes 450 and 460 may include a material such as copper or aluminum. According to the embodiment, adhesion is performed between the first insulation layer 410 and the second insulation layer 411 and between the pressure electrodes 450 and 460 and the first insulation layer 410 by means of an adhesive (not shown) such as a liquid bond. Also, according to the embodiment, the pressure electrodes 450 and 460 according to the embodiment may be formed by positioning a mask, which has a through-hole corresponding to a pressure electrode pattern, on the first insulation layer 470, and then by spraying a conductive material.

In FIG. 4a, the pressure detection module 400 further includes an elastic foam 440. The elastic foam 440 may be formed on one side of the second insulation layer 411 in a direction opposite to the first insulation layer 410. Later, when the pressure detection module 400 is attached to the substrate 300, the elastic foam 440 may be disposed on the substrate 300 on the basis of the second insulation layer 411.

Here, an adhesive tape 430 having a predetermined thickness may be formed on the outside of the elastic foam 440 so as to attach the pressure detection module 400 to the substrate 300. According to the embodiment, the adhesive tape 430 may be a double adhesive tape. Here, the adhesive tape 430 may function to adhere the elastic foam 440 to the second insulation layer 411. Here, the adhesive tape 430 is disposed on the outside of the elastic foam 440, thereby effectively reducing the thickness of the pressure detection module 400.

When the pressure detection module 400 shown in FIG. 4a is attached to the substrate 300 located thereunder, the pressure electrodes 450 and 460 may operate to detect the pressure. For example, the pressure electrodes 450 and 460 is disposed on the display module 200 side, and the reference potential layer may correspond to the substrate 300 and the elastic foam 440 may perform an action corresponding to the spacer layer 420. For instance, when the top of the touch input device is touched, the elastic foam 440 is pressed and then the distance between the substrate 300, i.e., the reference potential layer and the pressure electrodes 450 and 460 is reduced. As a result, the mutual capacitance between the first electrode 450 and the second electrode 460 may be reduced. Through this capacitance change, the magnitude of the touch pressure can be detected.

Figure 4B:
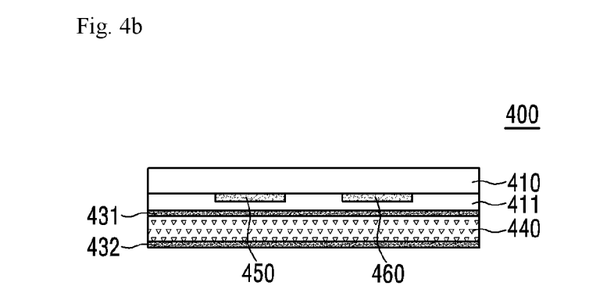

Unlike FIG. 4a, the pressure detection module 400 is not attached to the substrate 300 by means of the adhesive tape 430 disposed on the outside of the elastic foam 440 in FIG. 4b. FIG. 4b may include a first adhesive tape 431 for adhering the elastic foam 440 to the second insulation layer 411, and a second adhesive tape 432 for adhering the pressure detection module 400 to the substrate 300. The second adhesive tape 432 is placed on the elastic foam 440. As such, the first and the second adhesive tapes 431 and 432 are disposed, thereby securely attaching the elastic foam 440 to the second insulation layer 411 and thereby securely attaching the pressure detection module 400 to the substrate 300. According to the embodiment, the pressure detection module 400 shown in FIG. 4b may not include the second insulation layer 411. For example, the first adhesive tape 431 may not only functions as a cover layer which directly covers the pressure electrodes 450 and 460, but also function to attach the elastic foam 440 to the first insulation layer 410 and the pressure electrodes 450 and 460. This can be applied to the following FIGS. 4c to 4f.

Figure 4C:
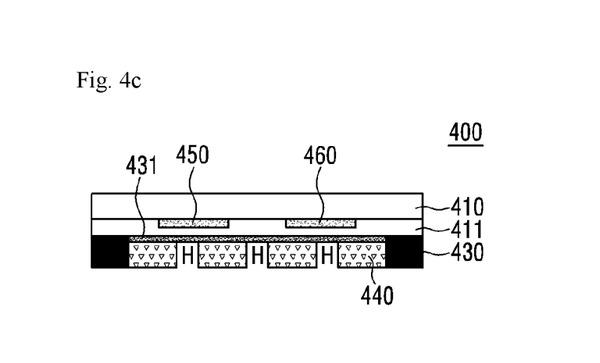

FIG. 4c shows a modified example of the structure shown in FIG. 4a. In FIG. 4c, the elastic foam 440 has a hole H formed therein to have a length as long as the height of the elastic foam 440, so that the elastic foam 440 can be well pressed when the touch input device is touched. The hole H may be filled with air. When the elastic foam 440 is well pressed, the pressure detection sensitivity may be improved. Also, the hole H formed in the elastic foam 440 makes it possible to prevent the surface of the elastic foam 440 from protruding due to the air at the time of attaching the pressure detection module 400 to the substrate 300, etc. In FIG. 4c, the first adhesive tape 431 as well as the adhesive tape 430 may be further included in order to securely adhere the elastic foam 440 to the second insulation layer 411.

Figure 4D:
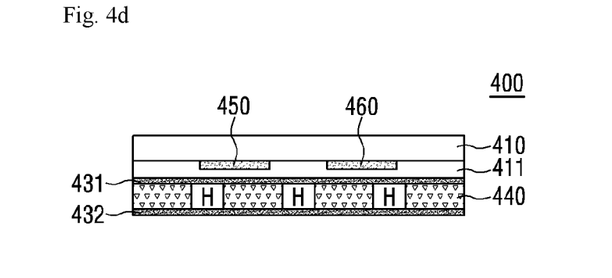

FIG. 4d shows a modified example of the structure shown in FIG. 4b. As with FIG. 4c, the elastic foam 440 has the hole H formed therein to have a length as long as the height of the elastic foam 440.

Figure 4E:
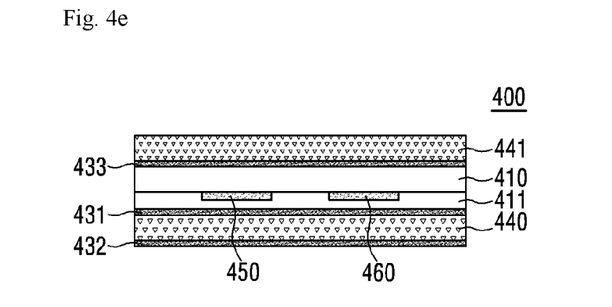

FIG. 4e shows a modified example of the structure shown in FIG. 4b. A second elastic foam 441 is further included on one side of the first insulation layer 410, that is, the opposite side to the elastic foam 440. The second elastic foam 441 may be further formed to minimize the impact transmitted to the display module 200 when the pressure detection module 400 is attached later to the touch input device. Here, a third adhesive layer 433 may be further included in order to adhere the second elastic foam 441 to the first insulation layer 410.

Figure 4F:
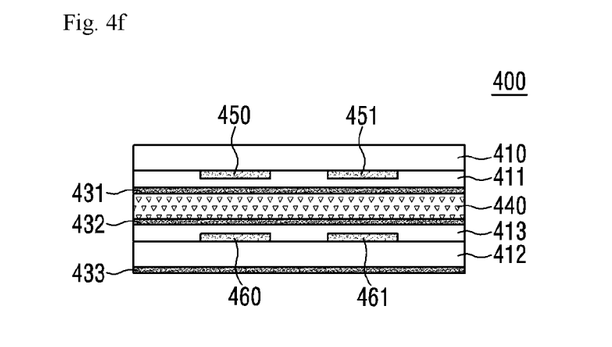

FIG. 4f shows the structure of the pressure detection module 400 capable of detecting the pressure. FIG. 4f shows the structure of the pressure detection module 400 in which the first electrodes 450 and 451 and the second electrodes 460 and 461 are disposed with the elastic foam 440 placed therebetween. Similarly to the structure described with reference to FIG. 4b, the first electrodes 450 and 451 are formed between the first insulation layer 410 and the second insulation layer 411, and the first adhesive tape 431, the elastic foam 440, and the second adhesive tape 432 may be formed. The second electrodes 460 and 461 are formed between a third insulation layer 412 and a fourth insulation layer 413, and the fourth insulation layer 413 may be attached to one side of the elastic foam 440 by means of the second adhesive tape 432. Here, the third adhesive tape 433 may be formed on the substrate-side surface of the third insulation layer 412, and the pressure detection module 400 may be attached to the substrate 300 by means of the third adhesive tape 433. As described with reference to FIG. 4b, according to the embodiment, the pressure detection module 400 shown in FIG. 4f may not include the second insulation layer 411 and/or the fourth insulation layer 413. For example, the first adhesive tape 431 may not only functions as a cover layer which directly covers the first electrodes 450 and 451, but also function to attach the elastic foam 440 to the first insulation layer 410 and the first electrodes 450 and 451. Also, the second adhesive tape 432 may not only functions as a cover layer which directly covers the second electrodes 460 and 461, but also function to attach the elastic foam 440 to the third insulation layer 412 and the second electrodes 460 and 461.

Here, the elastic foam 440 is pressed by the touch on the touch input device, and thus, the mutual capacitance between the first electrodes 450 and 451 and the second electrodes 460 and 461 may be increased. Through this capacitance change, the touch pressure can be detected. Also, according to the embodiment, any one of the first electrode 450 and 451 and the second electrode 460 and 461 is grounded, and thus, a self-capacitance can be detected by the other electrode.

In FIG. 4f, the thickness and manufacturing cost of the pressure detection module 400 become larger than those of a case where the electrode is formed in the form of a single layer. However, it is possible to ensure the pressure detection performance which is not changed by the characteristics of the reference potential layer located outside the pressure detection module 400. That is, the pressure detection module 400 is configured as shown in FIG. 4f, so that an effect due to an external potential (ground) environment can be minimized at the time of detecting the pressure. Therefore, the same pressure detection module 400 can be used regardless of the kind of the touch input device to which the pressure detection module 400 is applied.

In the foregoing, it has been described by using the pressure electrode including the drive electrode and the receiving electrode that the pressure is detected on the basis of the change amount of the mutual capacitance which is changed as the drive electrode and the receiving electrode become closer to the reference potential layer. However, the pressure detection module 400 of the present invention may also perform the touch pressure detection on the basis of the self-capacitance change amount.

Briefly describing, the touch pressure can be detected by using the self-capacitance which is formed between the reference potential layer and the pressure electrode (any one of the drive electrode and the receiving electrode). That is to say, the touch pressure can be detected by using the self-capacitance formed between the drive electrode and the reference potential layer and/or the self-capacitance formed between the receiving electrode and the reference potential layer. When the touch pressure is not applied even by user's touch, the distance between the pressure electrode and the reference potential layer is not changed, so that the self-capacitance change is not changed. In this case, only the touch position by the touch sensor panel 100 would be detected. However, when even the touch pressure is applied, the self-capacitance is changed in the above manner, and the pressure detection module 400 detects the touch pressure on the basis of the change amount of the self-capacitance.

Specifically, when the pressure is applied by the touch, the reference potential layer or the pressure electrode (drive electrode or receiving electrode) moves, so that the distance between the reference potential layer and the pressure electrode is reduced and the value of the self-capacitance is increased. On the basis of the increased value of the self-capacitance, the touch pressure is detected by determining the magnitude of the touch pressure.

Hereafter, an embodiment of the display module 200 will be described. The display module 200 that is one component of the touch input device according to the embodiment of the present invention may include an OLED panel.

The OLED panel has more advantages than a LCD panel, and thus, is in the trend of being used in a device requiring displays in various fields. The LCD panel controls electrical stimulation by inserting liquid crystal having an intermediate property between solid and liquid between two glass plates, and displays characters or images by refracting the light generated within the liquid crystal. Since such an LCD requires a backlight unit, the display becomes thicker and electric power should be always applied to the backlight unit. Therefore, the LCD has a high power consumption and a response speed less than that of the OLED.

Meanwhile, the OLED panel is a self-light emitting display panel which uses a principle in which current flows through a fluorescent or phosphorescent organic thin film and then electrons and electron holes are combined in the organic layer, so that light is generated. The organic matter constituting the light emitting layer determines the color of the light. Specifically, the OLED uses a principle in which when electricity flows and an organic matter is applied on glass or plastic, the organic matter emits light. That is, the principle is that electron holes and electrons are injected into the anode and cathode of the organic matter respectively and are recombined in the light emitting layer, so that a high energy exciton is generated and the exciton releases the energy while falling down to a low energy state and then light with a particular wavelength is generated. Here, the color of the light is changed according to the organic matter of the light emitting layer.

The OLED includes a line-driven passive-matrix organic light-emitting diode (PM-OLED) and an individual driven active-matrix organic light-emitting diode (AM-OLED) in accordance with the operating characteristics of a pixel constituting a pixel matrix. None of them require a backlight. Therefore, the OLED enables a very thin display module to be implemented, has a constant contrast ratio according to an angle and obtains a good color reproductivity depending on a temperature. Also, it is very economical in that non-driven pixel does not consume power.

In terms of operation, the PM-OLED emits light only during a scanning time at a high current, and the AM-OLED maintains a light emitting state only during a frame time at a low current. Therefore, the AM-OLED has a resolution higher than that of the PM-OLED and is advantageous for driving a large area display panel and consumes low power. Also, a thin film transistor (TFT) is embedded in the AM-OLED, and thus, each component can be individually controlled, so that it is easy to implement a delicate screen.

Figure 5A:
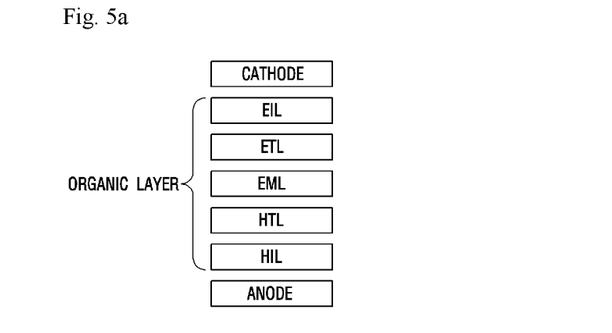
FIG. 5a is a view showing a component of an OLED panel which may be included in a display module that is one component of the touch input device according to the embodiment of the present invention.

FIG. 5a is a view showing a component of the OLED panel which may be included in the display module 200 that is one component of the touch input device according to the embodiment of the present invention.

As shown in FIG. 5a, the OLED consists basically of an anode, an organic layer, and a cathode. The organic layer includes a hole injection layer (HIL), a hole transport layer (HTL), an emission material layer (EIL), an electron transport layer (ETL), and electron injection layer (EML).

Briefly speaking, the HIL functions to inject electron holes and is made of CuPc, etc. The HTL functions to move the injected electron holes and should has a good hole mobility. The HTL may be made of Arylamine, TPD, and the like. The EIL and ETL inject and transport electrons. The injected electrons and electron holes are combined in the EML and emit light. The EML represents the color of the emitted light and is composed of a host determining the lifespan of the organic matter and an impurity (dopant) determining the color sense and efficiency.

Figure 5B:
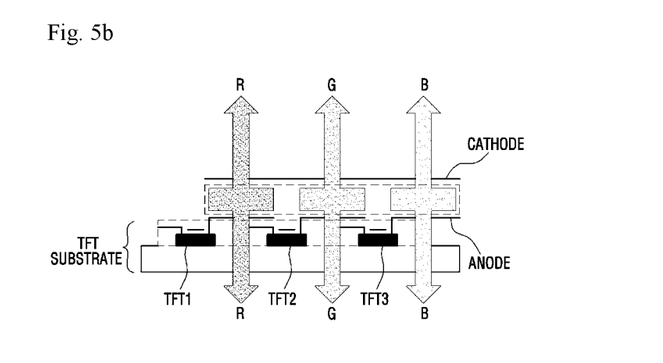
FIG. 5b is a cross section of an AM-OLED panel according to one embodiment.

FIG. 5b shows the cross section of the AM-OLED panel among them, which is widely used in mobile devices such as a smartphone, etc. The AM-OLED will be briefly described. As shown in FIG. 5b, the AM-OLED panel consists of a thin film transistor (TFT) backplane, an anode, an organic layer, a cathode, and a polarizer. Meanwhile, there are various types of the AM-OLED panel. In the RGB type AM-OLED panel among them, one pixel is composed of three primary colors (Red, Green, and Blue) and determines the color of the light.

Regarding the AM-OLED panel, as shown in FIG. 5b, when the organic layer is inserted between the anode and the cathode and the TFT becomes an on-state, a driving current is applied to the anode and the electron holes are injected, and the electrons are injected to the cathode. Then, the electron holes and electrons move to the organic layer and meet each other and then emit the light.

The display module 200 of the touch input device according to the embodiment of the present invention may include the OLED panel (AM-OLED panel or PM-OLED panel). Various components (e.g., the pressure detection module 400, the reference potential layer 610, etc.) for detecting the touch pressure are stacked under the display module 200 using the OLED panel.

Figure 9:
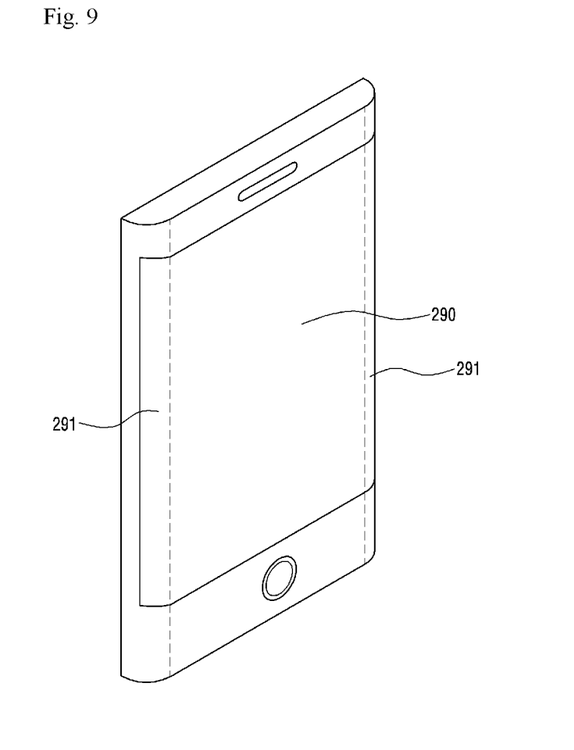
FIG. 9 is a view showing an application example of the touch input device according to the embodiment of the present invention.
Figure 10:
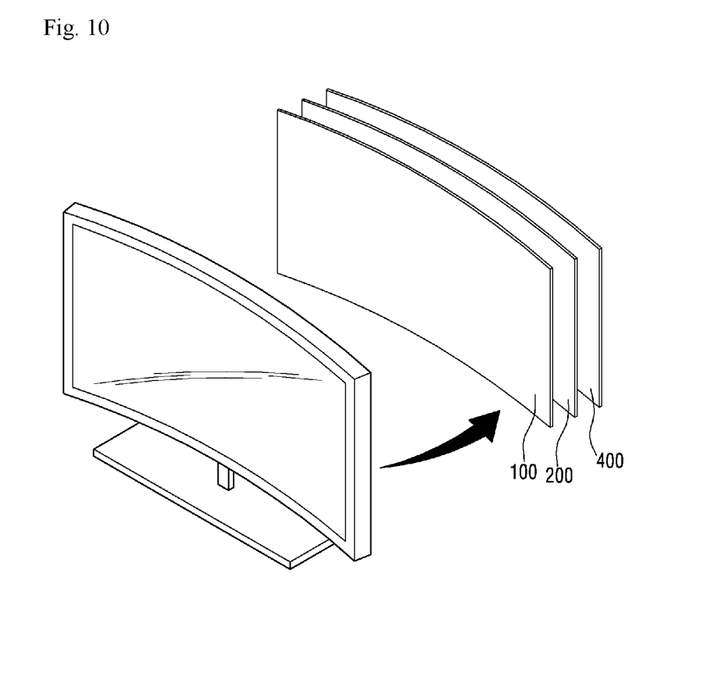
FIG. 10 is a view showing an application example of the touch input device according to another embodiment of the present invention.
Figure 11:
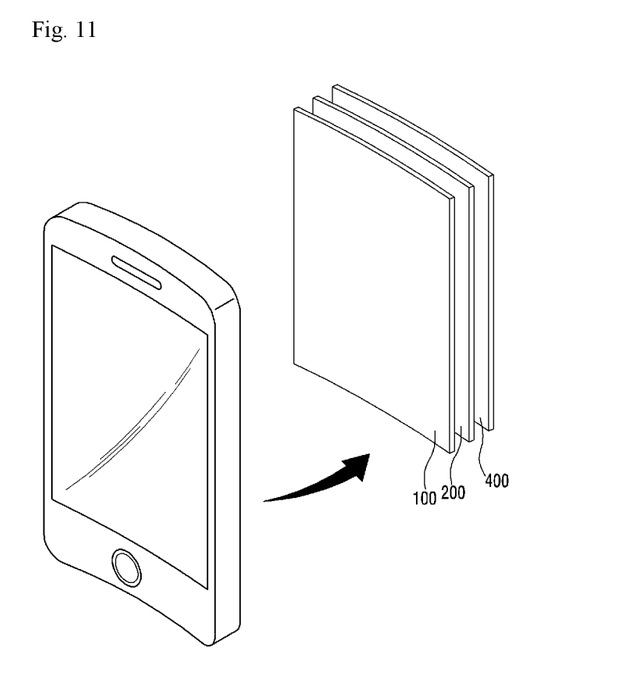
FIG. 11 is a view showing an application example of the touch input device according to further another embodiment of the present invention.

The touch input device according to the embodiment of the present invention may be used in a variety of devices (e.g., smartphone, TV, etc.) shown in FIGS. 9 to 11. However, as described above, the touch input device can be used without limitation not only in a portable electronic product such as a smartwatch, tablet PC, laptop, personal digital assistants (PDA), MP3 player, camera, camcorder, electronic dictionary, etc., but also in an electric home appliance such as a home PC, TV, DVD, refrigerator, air conditioner, microwave, etc., industrial control devices, medical equipment, etc.

First, FIG. 9 shows that the touch input device according to the embodiment of the present invention has been implemented with a smartphone. Particularly, in the embodiment of FIG. 9, the display module 200 may have a curved edge shape.

In the embodiment of FIG. 9, the display module 200 has a shape having a flat portion 290 and a curved portion 291. Here, the flat portion 290 may be located at the center and the curved portion 291 may extend from the flat portion 290 and be formed on both sides. The curved portion 291 may have a shape curved with a predetermined curvature.

Here, it is enough as long as the predetermined curvature allows the user to easily recognize the image displayed on the display module 200 or to operate the pressure detection module 400 or the touch sensor panel 100 which is formed on or under the display module 200. The embodiment of the present invention is not limited to a specific curvature of the curved portion 291.

Meanwhile, although FIG. 9 shows that the curved portion 291 is formed on both sides of the display module 200, the curved portion 291 may be formed only on the right or left side of the flat portion 290.

FIGS. 10 and 11 show that the touch input device according to the embodiment of the present invention has been applied to a TV and a smartphone which are curved as a whole. As shown in FIGS. 10 and 11, the display module 200 may have a shape of which the central portion is curved downward as a whole.

Unlike this, the display module 200 may also have a shape of which the central portion is curved upward as a whole. Also, contrary to the embodiment of FIGS. 10 and 11 in which the display module 200 is horizontally curved, the display module 200 may be assumed to be vertically curved.

Furthermore, the touch input device according to the embodiment of the present invention may be implemented to have a shape which can be curved within a predetermined range by using an appropriate display panel (e.g., AM-OLED panel or LCD panel) and a substrate made of a flexible material, etc.

Figure 6:
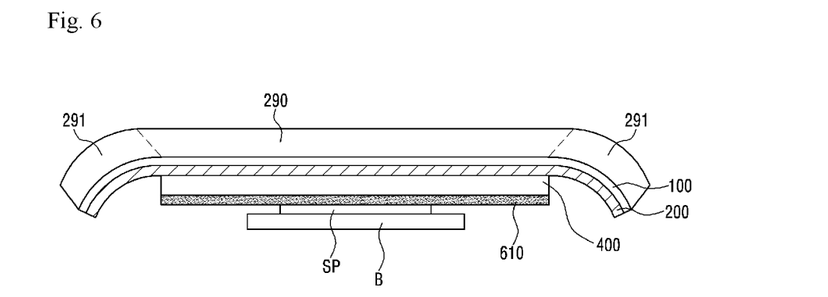
FIGS. 6 to 8 are views showing a stack structure of the touch input device according to various embodiments of the present invention.
Figure 7:
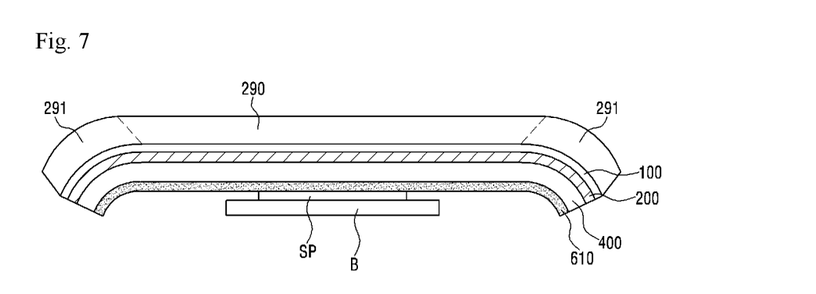
Figure 8:
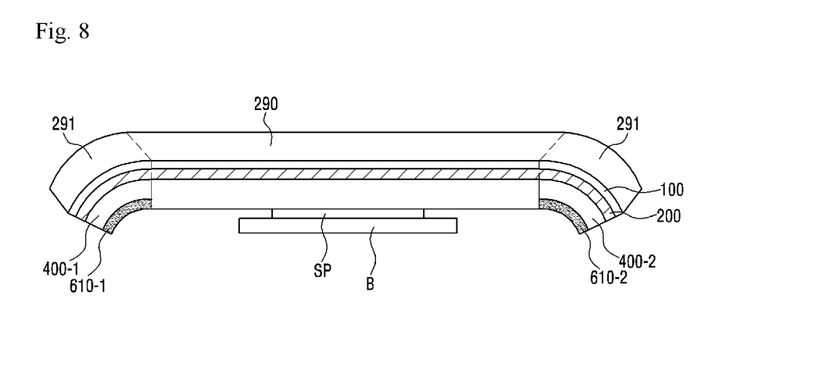

FIGS. 6 to 8 show the stack structure of the touch input device according to various embodiments of the present invention. Specifically, FIGS. 6 to 8 show the stack structure of the touch input device for which the embodiment of FIG. 9 has been assumed.

By using the display module 200 having the flat portion 290 and the at least curved portion 291 as shown in FIG. 9, the touch input device according to the embodiment of the present invention may be implemented to have the stack structure of FIGS. 6 to 8.

The touch input device according to the embodiment of FIG. 6 includes the pressure detection module 400 only vertically under the flat portion 290 of the display module 200.

In other words, the pressure detection module 400 is not positioned under the curved portion 291. Whereas, the touch sensor panel 100 may be disposed on the entire surface of the display module 200.

As shown in FIG. 6, when the pressure detection module 400 (and the reference potential layer 610) are present on the flat portion 290, more specifically, only under the flat portion 290, the touch pressure is detected only on the flat portion 290 of the display module 200 while the touch position is detected on the total area of the display module 200, because the touch sensor panel 100 is disposed on the entire surface of the display module 200.

That is to say, in the touch input device according to the embodiment of FIG. 6, the touch pressure cannot be applied to both sides of the display module 200. Accordingly, an unintentional touch input (position and pressure) by user's grip can be prevented.

For example, in the state where the smartphone including the touch input device according to the embodiment of the present invention is put into a pocket, when both sides of the display module 200 are pressed unintentionally and then an unintentional touch pressure is applied, it is possible to prevent that the pressure detection module 400 detects the touch pressure and operations consequent thereto are performed.

The touch input device according to the embodiment of FIG. 7 has a structure in which the touch sensor panel 100, the pressure detection module 400 (and the reference potential layer 610) are formed on the entire surface of the display module 200.

Therefore, since the touch input device according to the embodiment of FIG. 7 is able to detect the touch position and touch pressure on the entire area of the display module 200, the user can perform the touch input in any area of the display module 200.

Unlike the embodiment of FIG. 6, in the touch input device according to the embodiment of FIG. 7, the input by an existing mechanical button can be replaced by the input by the touch pressure because the touch pressure is detected on the curved portion 291 as well as on the flat portion 290.

Namely, the user presses both sides of the display surface instead of pressing the button, thereby feeling a sense of use of pressing the button as it is.

In the touch input device according to the embodiment of FIG. 8, the pressure detection module 400 (and the reference potential layer 610) are formed only under the curved portion 291 of the display module 200.

Therefore, in the touch input device according to the embodiment of FIG. 8, the pressure can be detected only in the curved portion 291 of the display module 200. As a result, the user presses both sides of the display surface instead of pressing the button, thereby feeling a sense of use of pressing the button in a similar manner. Meanwhile, only the detection of the touch position by the touch sensor panel 100 is possible in the area of the flat portion 290.

In the meantime, FIG. 8 shows that the touch sensor panel 100 is formed on the front side (flat portion 290 and curved portion 291) of the display module 200. Unlike this, however, it is possible to reduce the manufacturing cost and to simplify the structure by forming the touch sensor panel 100 only on the flat portion 290. Also, the touch sensor panel 100 may be formed only on the curved portion 291.

Here, since the touch input device according to the embodiment of FIG. 8 includes two pressure detection modules 400-1 and 400-2 spaced apart from each other, the touch input device may be designed to use one or two channels in order to drive the two pressure detection modules 400-1 and 400-2.

In other words, the two pressure detection modules 400-1 and 400-2 may detect the touch position and touch pressure by using different channels or may be detect the touch position and touch pressure by using one channel.

Also, in the embodiment of FIG. 8, the under area of the flat portion 290 can be used as a space for embedding other components for driving the touch input device. Therefore, spatial advantages can be obtained.

Meanwhile, though not shown in the drawings, unlike the embodiment of FIG. 8, when the curved portion 291 is provided only on right or left side of the display module 200, the touch sensor panel 100 and the pressure detection module 400 may be implemented as the touch input device capable of detecting the touch position and touch pressure by appropriately modifying the above-structure.

With regard to FIGS. 6 to 8, while it has been described that the touch sensor panel 100 is positioned as a separate component on the display module 200, it can be considered that the touch sensor panel 100 is integrally formed with the display module 200. That is, the touch sensor panel 100 may be implemented in an in-cell method, and the touch input device according to the embodiment of the present invention may be implemented in various ways without being limited to the specific arrangement of the touch sensor panel 100 and the display module 200.

Meanwhile, the touch input device according to the embodiment of FIGS. 6 to 8 may include a battery B which supplies electric power to each component for detecting the touch input. Also, a shock absorber SP may be further provided, which ensures the reliable drive of the touch input device and prevents damages caused by the shock.

In the structure of the touch input device according to the embodiment of FIGS. 6 to 8, since the structure and function of the reference potential layers 610, 610-1, and 610-2 are the same as those described above, the detailed description thereof will be omitted. While the stack structure of the pressure detection module 400 and the reference potential layers 610, 610-1, and 610-2 has been described above by the structure shown in FIG. 2, it is apparent to those skilled in the art that the pressure detection module 400 and the reference potential layers 610, 610-1, and 610-2 can be implemented by various stack structures described herein.

Also, it can be easily understood that various embodiments of FIGS. 3a to 3d can be applied as the structure of the pressure electrode of the pressure detection module 400 and various embodiments of FIGS. 4a to 4f can be applied as the detailed structure of the pressure detection module 400. Needless to say, the touch input device according to the embodiment of the present invention is not limited to the structure of the pressure electrode according to FIGS. 3a to 3d or to the pressure detection module of FIGS. 4a to 4f.

In the foregoing description with reference to FIGS. 6 to 8, the touch input device is formed by assuming the form of the display module 200 shown in FIG. 9. Even in the case of the embodiments of FIGS. 10 and 11, the touch input device may be implemented to be able to function to detect the touch position and touch pressure by modifying or changing the stack structure of FIGS. 6 to 8. A person having ordinary skill in the art would be able to design without difficulty in the above-described manner.

Figure 12:
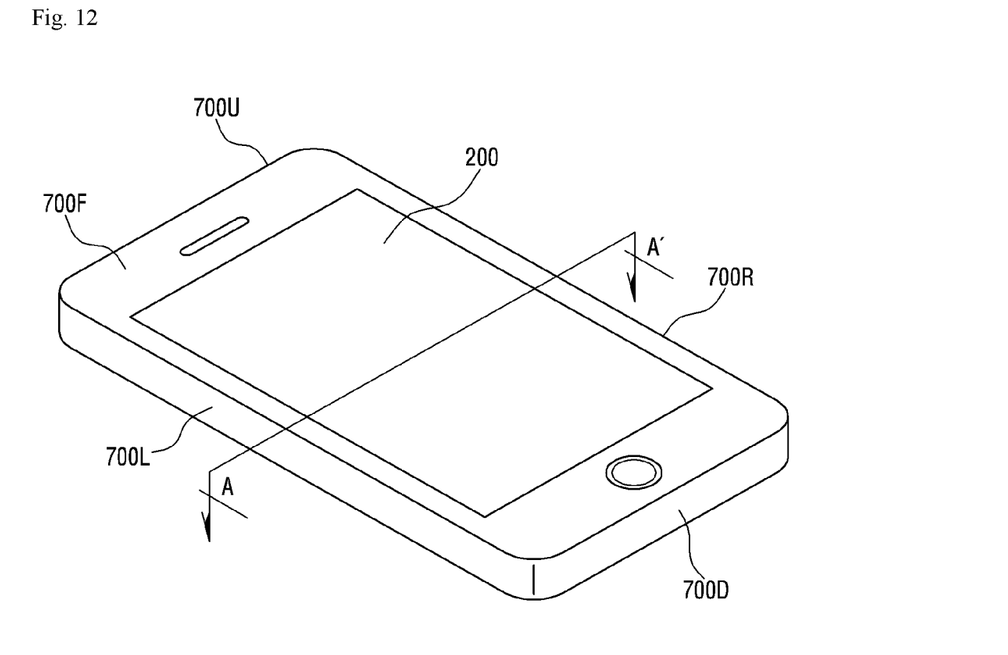
FIG. 12 is a perspective view of the touch input device according to yet another embodiment of the present invention.

FIG. 12 is a perspective view of the touch input device according to the embodiment of the present invention. The touch input device shown in FIG. 12a includes a front side 700F in which the display module 200 is provided, a left side 700L, a right side 700R, an up side 700U, and a down side 700D which extend vertically from the front side 700F, and a back side.

The display module 200 is provided in the front side 700F of the touch input device according to the embodiment of FIG. 12. The touch sensor panel 100 is stacked on the display module 200. As described above, when the front side 700F of the touch input device is touched, the touch sensor panel 100 detects the touch position.

Meanwhile, the pressure detection module 400 is included in at least one of the sides 700L, 700R, 700U, and 700D of the touch input device and detects the touch pressure of the user.

The touch sensor panel 100 and the display module 200 are provided in the front side 700F, and the pressure detection module 400 is provided in the right and left sides 700R and 700L.

The pressure detection module 400 may be provided in the form of any one of FIGS. 4a to 4f. However, the pressure detection module 400 is not limited to this and may be implemented to have a variety of structures capable of detecting the touch pressure through the capacitance change according to the distance change between the reference potential layer and the pressure detection module.

Meanwhile, in the embodiment, a side cover may be stacked on the pressure detection module 400 provided in the right and left sides 700L and 700R. The side cover SC covers the border of the touch input device, thereby functioning to protect the pressure detection module 400 and preventing the introduction of foreign substances.

If the user presses with his/her finger, etc., the pressure detection is possible when the distance between the electrode and the reference potential layer can be changed. Therefore, it is preferable that the side cover formed on the pressure detection module 400 should be made of a material (e.g., rubber, silicone rubber, etc.) which is bent inward within a predetermined range when the user presses with his/her finger.

While the pressure detection module 400 is provided both in the left side 700L and the right side 700R, it is possible that the pressure detection module 400 is provided only in one of them. In another embodiment, the pressure detection module 400 may be provided in at least one of the up and down sides 700U and 700D. Further, if necessary, the pressure detection module 400 may be formed on the back side of the touch input device. That is, touch input device according to the embodiment of the present invention, the pressure detection module 400 may be provided in at least one of the right, left, up and down sides 700L, 700R, 700U, and 700D and back side.

Figure 13:
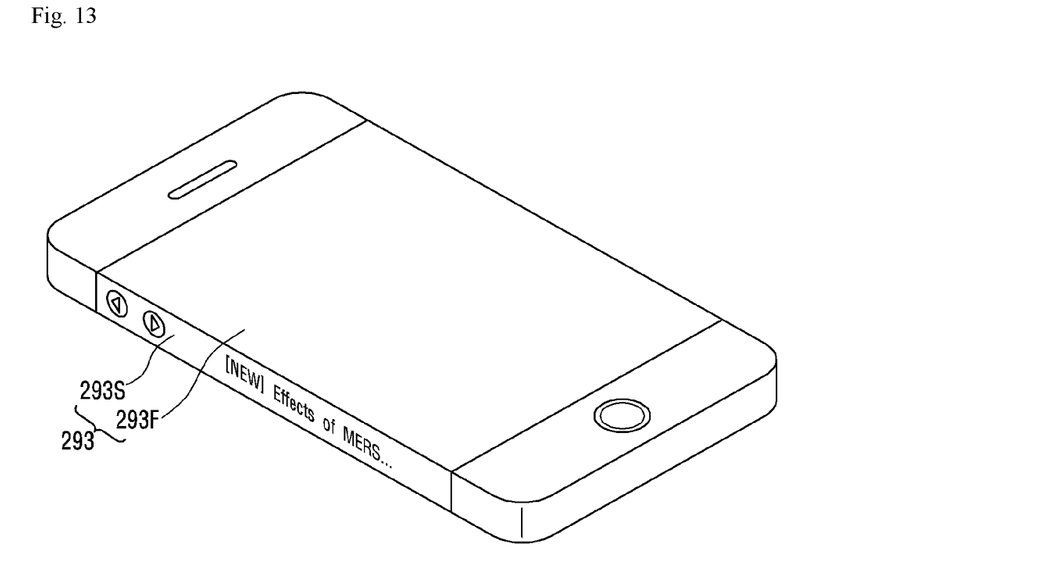
FIG. 13 is a perspective view of the touch input device according to still another embodiment of the present invention.

FIG. 13 is a perspective view of the touch input device according to still another embodiment of the present invention. Also in the embodiment of FIG. 13, the pressure detection module 400 is provided in the side as shown in FIG. 12*a*.

However, the pressure detection module 400 is covered with the side cover, the embodiment of FIG. 13 shows that a side display module 293S is formed on the pressure detection module 400.

More specifically, the touch input device according to the embodiment of FIG. 13 includes a front display module 293F formed on the front side and the side display module 293S formed on the side. The side display module 293S extends from the front display module 293F. FIG. 13 shows that the side display module 293S extends vertically from the front display module 293F. However, unlike this, the side display module 293S may extend to be obliquely bent.

The touch sensor panel 100 may be provided on the front display module 293F, and the pressure detection module 400 may be provided under the side display module 293S. Here, the pressure detection module 400 may be provided in the form of any one of FIGS. 4*a* to 4*f*. However, the pressure detection module 400 is not limited to this and may be implemented to have a variety of structures capable of detecting the touch pressure through the capacitance change according to the distance change between the reference potential layer and the pressure detection module.

Meanwhile, though not explicitly shown in FIG. 13, the pressure detection module 400 may be further included under the front display module 293F, and a side touch sensor panel may be further included on the side display module 293S. In this case, it becomes to obtain an effect of detecting the touch position and touch pressure on all the sides to display.

Also, the front display module 293F and the side display module 293S may be integrally formed as one display module (one component) or may be formed by connecting independent display modules (separate components). A person skilled in the art to which the present invention belongs may select an appropriate structure or arrangement in consideration of the drive method of the display module, etc.

Figure 14:
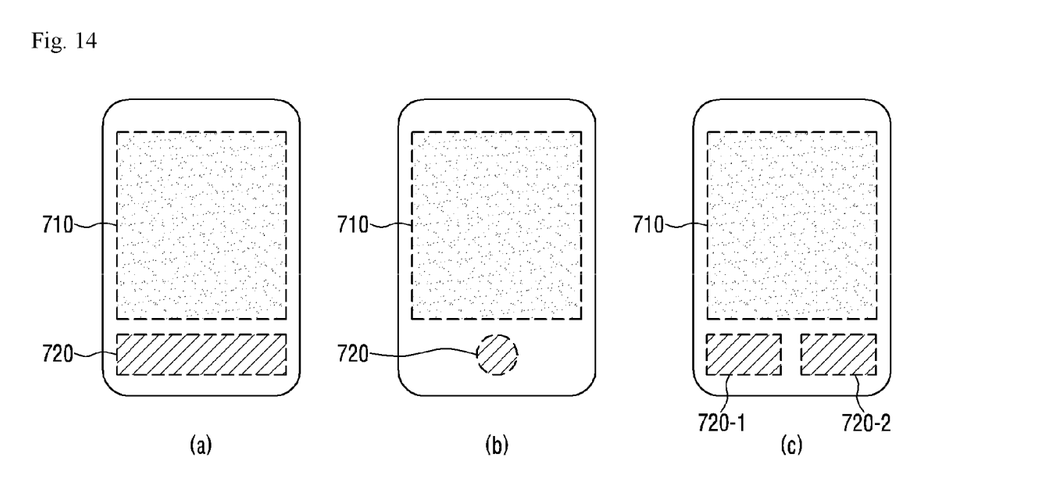
FIG. 14 is a schematic view showing the touch input device according to various embodiments of the present invention.

FIG. 14 is a schematic view showing the touch input device according to various embodiments of the present invention. As shown in FIG. 14, the front side of the touch input device may include a display area 710 and a non-display area 720.

Here, the display module 200 is provided in the display area 710 and is not provided in the non-display area 720. Therefore, the touch input device according to the embodiment of FIG. 14 has a display function only in the display area 710.

At least one pressure detection module 400 is provided at the inside of the non-display area 720. The inside of the non-display area 720 is not visible from the outside but may be visible in some cases. Therefore, when the user presses the non-display area 720 with his/her finger, the touch pressure may be detected in the above-described manner.

The pressure detection module 400 included within the non-display area 720 in the touch input device according to the embodiment of FIG. 14 may be provided in the form of any one of FIGS. 4*a* to 4*f*. However, the pressure detection module 400 is not limited to this and may be implemented to have a variety of structures capable of detecting the touch pressure through the capacitance change according to the distance change between the reference potential layer and the pressure detection module.

Meanwhile, the pressure detection module 400 may be formed in the non-display area 720 in various forms. For example, as shown in (a) of FIG. 14, the pressure detection module 400 having the same size as the width of the display module 200 may be formed under the display area 710 where the display module 200 is located. As shown in (b) of FIG. 14, the pressure detection module 400 may be formed only in a predetermined area (a button-shaped circular area). As shown in (c) of FIG. 14, two pressure detection modules 400 may be formed apart from each other.

In the meantime, in the embodiment of FIG. 14, if the user presses the non-display area 720 with his/her finger, etc., the pressure detection is possible when the distance between the reference potential layer and the electrode of the pressure detection module 400 can be changed. Therefore, a cover layer made of a flexible material (e.g., rubber ring, etc.) may be stacked on the pressure detection module 400. The cover layer may be a case of the touch input device.

The pressure detection module 400 is provided through various embodiments of FIG. 14, and then the pressure detection module 400 can be used as a physical button. A predetermined pattern is printed on the non-display area 720, and thus, it is possible to intuitively check an application, etc., to be executed by the user's pressing. Also, the application execution may be made by the detection of the touch pressure. This may be accomplished by the above-described pressure detection method.

With regard to FIGS. 9 to 14 showing the embodiment in which the touch input device according to the present invention has been substantially implemented, while the foregoing has focused on the display, touch input detection, and the components enabling the touch pressure detection, it is apparent to those skilled in the art that each embodiment includes a configuration allowing the touch input device to operate as a device, e.g., a smartphone.

Also, with regard to FIGS. 9 to 14, when two or more pressure detection modules are included or are provided in different positions, not only the pressure detection module can be driven by one channel, but also each of the pressure detection modules can be driven by two or more channels. When the pressure detection module is composed of multi channels, respective pressure detection modules can be simultaneously individually controlled, so that more excellent pressure detection can be ensured. Similarly, the display module or the touch sensor panel related to the position detection can be also controlled by two or more channels. A person having ordinary skill in the art is able to freely design the channels of the pressure detection module, the touch sensor panel, and the display module.

For example, when the touch input device is implemented as a communication device such as a smartphone, etc., a conventional form or method can be applied to the components of a communication module, a control module, a storage module, etc. If necessary, the components can be appropriately modified or be replaced with another in accordance with the configuration, arrangement, size, shape, and operation method, etc., of the embodiment of the present invention.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

The invention claimed is:

1. A touch input device comprising:
a display module comprising a flat portion and at least one curved portion which extends from the flat portion and is curved with a predetermined curvature;
a window comprising a flat window disposed on the flat portion of the display module and at least one curved window which is disposed on the curved portion of the display module, extends from the flat window and is curved with the predetermined curvature; and
a pressure detection module comprising at least one pressure electrode, the pressure detection module disposed under the curved portion of the display module without being disposed under the flat portion, and detects a touch pressure applied to a surface of the curved portion of the display module,
wherein the pressure detection module detects the touch pressure on a basis of a change of electrical characteristics as the curved portion is bent,
wherein the pressure detection module comprises a substrate disposed under the curved portion of the display module and a spacer layer disposed between the curved portion of the display module and the substrate,
wherein the pressure electrode is disposed between the curved portion of the display module and the substrate, and attached one of the curved portion of the display module and the substrate.

2. The touch input device of claim 1, further comprising a reference potential layer disposed apart from the pressure electrode, wherein the pressure electrode detects the touch pressure on the basis of a capacitance change amount according to a distance change between the pressure electrode and the reference potential layer by the touch.

3. The touch input device of claim 1, wherein the display module comprises an OLED panel.

4. The touch input device of claim 2, wherein the reference potential layer is formed of a substrate made of a flexible material.

5. The touch input device of claim 1, wherein the at least one curved portion of the display module extends from both sides of the flat portion of the display module.

6. A touch input device capable of detecting a touch position and a touch pressure, wherein the touch input device comprises:
a touch sensor panel which detects the touch position; and
a display module which is provided under the touch sensor panel,
wherein the display module comprises a front display module formed on a front side of the touch input device, and a side display module which extends vertically from the front display module at a right angle and formed on a side of the touch input device,
wherein a pressure detection module comprises at least one pressure electrode disposed under the side display module without being disposed under the front display module, and detects a touch pressure applied to the side of the touch input device,
wherein the pressure detection module comprises a substrate disposed under the side display module and a spacer layer disposed between the side display module and the substrate,
wherein the pressure electrode is disposed between the side display module and the substrate, and attached one of the side display module and the substrate,
wherein, when the touch pressure is applied, the side display module is bent,
wherein electrical characteristics detected from the pressure electrode of the pressure detection module change according to a bend of the side display module,
wherein the touch pressure is detected based on a change of electrical characteristics.

7. The touch input device of claim 6, wherein the pressure electrode of the pressure detection module is located under a side cover provided on the side of the touch input device.

8. The touch input device of claim 6, wherein the touch sensor panel comprises a front touch sensor panel which is provided on the front display module and detects the touch position on the front side, and a side touch sensor panel which is provided on the side display module and detects the touch position on the side.

9. The touch input device of claim 6, further comprising a reference potential layer disposed apart from the pressure electrode, wherein the pressure electrode detects the touch pressure on a basis of a capacitance change amount according to a distance change between the pressure electrode and the reference potential layer by the touch.

10. The touch input device of claim 6, wherein the display module comprises an OLED panel.

11. The touch input device of claim 9, wherein the reference potential layer is formed of a flexible substrate made of a flexible material.

* * * * *